US006680980B1

(12) United States Patent
Ashley et al.

(10) Patent No.: US 6,680,980 B1
(45) Date of Patent: Jan. 20, 2004

(54) SUPPORTING ME2PRML AND M2EPRML WITH THE SAME TRELLIS STRUCTURE

(75) Inventors: Jonathan Ashley, Los Gatos, CA (US); Razmik Karabed, San Jose, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/503,534

(22) Filed: Feb. 14, 2000

Related U.S. Application Data

(60) Provisional application No. 60/152,477, filed on Sep. 3, 1999.

(51) Int. Cl.[7] .................................................. H04L 5/12
(52) U.S. Cl. ........................ 375/265; 375/290; 714/792; 714/795
(58) Field of Search .............................. 375/262–265, 375/286, 290–291; 714/792, 794, 786, 795, 796, 810; 341/56, 59; 369/30.21, 30.22, 47.28, 47.29, 53.33, 59.22, 59.23; 360/25, 27, 41, 53, 65, 46, 31–32

(56) References Cited

U.S. PATENT DOCUMENTS

| | | | |
|---|---|---|---|
| 4,873,701 A | | 10/1989 | Tretter |
| 4,888,779 A | | 12/1989 | Karabed et al. |
| 4,939,555 A | | 7/1990 | Calderbank et al. |
| 5,111,483 A | | 5/1992 | Serfaty |
| 5,159,610 A | | 10/1992 | Eyuboglu et al. |
| 5,181,209 A | | 1/1993 | Hagenauer et al. |
| 5,214,672 A | | 5/1993 | Eyuboglu et al. |
| 5,291,499 A | | 3/1994 | Behrens et al. |
| 5,301,209 A | | 4/1994 | Wei |
| 5,327,440 A | | 7/1994 | Fredrickson et al. |
| 5,418,795 A | | 5/1995 | Itakura et al. |
| 5,497,384 A | | 3/1996 | Fredrickson et al. |
| 5,691,993 A | | 11/1997 | Fredrickson |
| 5,757,294 A | | 5/1998 | Fisher et al. |
| 5,768,320 A | * | 6/1998 | Kovacs et al. ............... 375/341 |
| 5,809,080 A | | 9/1998 | Karabed et al. |
| 5,809,081 A | * | 9/1998 | Karabed et al. ............. 375/263 |
| 5,841,818 A | | 11/1998 | Lin et al. |
| 5,844,922 A | | 12/1998 | Wolf et al. |
| 5,857,002 A | | 1/1999 | Melas |
| 5,881,075 A | | 3/1999 | Kong et al. |
| 5,974,091 A | * | 10/1999 | Huff ............................. 375/265 |
| 6,032,284 A | * | 2/2000 | Bliss ............................ 714/792 |
| 6,154,870 A | * | 11/2000 | Fredrickson et al. ......... 714/786 |
| 6,246,731 B1 | * | 6/2001 | Brianti et al. ................ 375/341 |
| 6,337,889 B1 | * | 1/2002 | Mita et al. .................... 375/341 |
| 6,373,407 B1 | * | 4/2002 | Nishiya et al. ................ 341/59 |

OTHER PUBLICATIONS

T.Sugawara, M. Yamagishi, H. Mutoh, K. Shimoda, and Y, Mizoshita, Apr. 13–16, 1993, IEEE Transactions on Magnetics, vol. 29, No. 6, "Viterbi Detector Including PRML and EPRML".*

Hideki Sawaguchi and Seiichi Mita, 1999, IEEE International Conference, vol. 3, pp. 1632–1637, "Soft–output Decoding for Concatenated Error Correction in High–Order PRML Channels".*

F. Dolivo, 1989, CompEuro '89 VLSI and Computer Peripherals. VLSI and Microelectronic Applications in Intelligent Peripherals and their interconnection Networks, Proceedings., p. 1/91–1/96, "Signal Processing for High–Density Digital Magnetic Recording".*

* cited by examiner

*Primary Examiner*—Don N. Vo
*Assistant Examiner*—Khanh Cong Tran
(74) *Attorney, Agent, or Firm*—Fish & Richardson P.C.

(57) ABSTRACT

A Viterbi trellis is provided which allows for implementation of either an EPRML type channel or an E2PRML type channel using a single trellis structure. According to a specific embodiment, a trellis is provided which can support a 0 mod 2 EPRML (M2EPRML) channel and a modified E2PRML (ME2PRML) channel.

14 Claims, 7 Drawing Sheets

SUPPORTING ME2PRML AND M2EPRML WITH THE SAME TRELLIS STRUCTURE

CROSS-REFERENCE TO RELATED APPLICATIONS

This application claims priority from U.S. Provisional Application Ser. No. 60/152,477, filed Sep. 3, 1999.

BACKGROUND OF THE INVENTION

1. Field of the Invention

The present invention relates to encoding for disk drives and, particularly, to an improved Viterbi trellis for sampled amplitude read channels.

2. Description of the Related Art

In order to achieve higher recording densities and reduce intersymbol interference, designers of magnetic recording channels have switched from analog peak detection techniques to sampled data detection techniques. In sampled data detection systems, the readback signal is filtered and sampled at a channel rate of 1/T, where T is the duration of a channel symbol.

One such technique is referred to as "partial response with maximum likelihood" (PRML). In PRML systems, the output of the noisy partial response channel is sampled at the channel rate and detected using a maximum likelihood Viterbi detector.

The partial response channel has a transfer function of the form $(1-D)(1+D)$ or $1-D^2$, where D represents a unit time delay operator with unit-time T. Thus, the noiseless output of the partial response channel is equal to the input signal minus a version of the input delayed in time by period 2T.

To further increase recording density and decrease the need for equalization, higher order PRML systems have been developed. The extended partial response with maximum likelihood (EPRML) channel has a transfer function of the form $(1-D)(1+D)^2$ or $(1+D-D^2-D^3)$. Thus, the noiseless output of the extended partial response channel is equal to the input signal minus a version of the input signal delayed in time by 2T, minus a version of the input signal delayed in time by 3T and plus a version of the input signal delayed in time by T. Similarly, the E2PRML channel has a transfer function of the form $(1-D)(1+D)^3$.

As noted above, Viterbi decoders are typically employed in sampled amplitude channels. Viterbi decoders are specific implementations of the Viterbi algorithm. A Viterbi detector unit is based on periodic examination of metrics associated with alternate sequences of recorded bits, wherein each sequence is typically labeled as a "path" and the associated metric is designated a "path metric." The most probable correct path is then determined by choosing a minimum path metric based on an iterative process involving successive comparison of associated path metrics.

In particular, two paths within a constrained, predetermined path length are examined. Since the recorded bit only depends on the constraint length corresponding to a finite number of neighbor bits, it becomes possible to abandon the path associated with the larger of the two path metrics corresponding to each path pair. Consequently, the number of possible paths can be restricted to a finite value by abandoning all but one of the total number of paths each time a new bit is added and examined during the data detection procedure. This process of path abandonment in order to compute the best path to each node of the trellis is executed by a sequence of operations commonly referred to as add-compare-select or ACS.

In many instances of implementing sampled amplitude channels, for example, it is desirable to implement a system of more than one partial response channel type. Conventionally, this has required implementation of unique trellises for each type. This is disadvantageous in that implementation costs are relatively increased. Further, implementing multiple partial response channel types each with its own trellis on a single integrated circuit chip can require different amounts of chip space, which can result in sub-optimal chip space usage.

SUMMARY OF THE INVENTION

These and other drawbacks in the prior art are overcome in large part by a system and method according to the present invention. In particular, the present invention allows for implementation of either an EPRML type channel or an E2PRML type channel using a single trellis structure. According to one implementation, a trellis is provided which can support a 0 mod 2 (i.e., there are an even number of 1's in every codeword) EPRML (M2EPRML) channel and a modified E2PRML (ME2PRML) channel.

According to one implementation, a sixteen-state trellis is provided. Sixteen of thirty-two edges in the M2EPRML carry the same non-return-to-zero (NRZ) values as the corresponding edges of the ME2PRML trellis, and sixteen of thirty-two edges carry the same sample values. The trellis supports M2EPRML if sixteen of its edges are eliminated every P clock cycles, where P is the block length of the code. The trellis can support ME2PRML sequences if four of its edges are eliminated every k mod 9 (k in {1, 2, 4, 6, 8}) clock cycles.

A better understanding of the invention is obtained when the following detailed description is considered in conjunction with the following drawings.

DETAILED DESCRIPTION OF THE INVENTION

FIGS. 1–7 illustrate a trellis implementation according to the present invention. Briefly, the trellis described employs the same structure to implement Viterbi detectors for an EPRML type channel and an E2PRML type channel.

Figure 1:
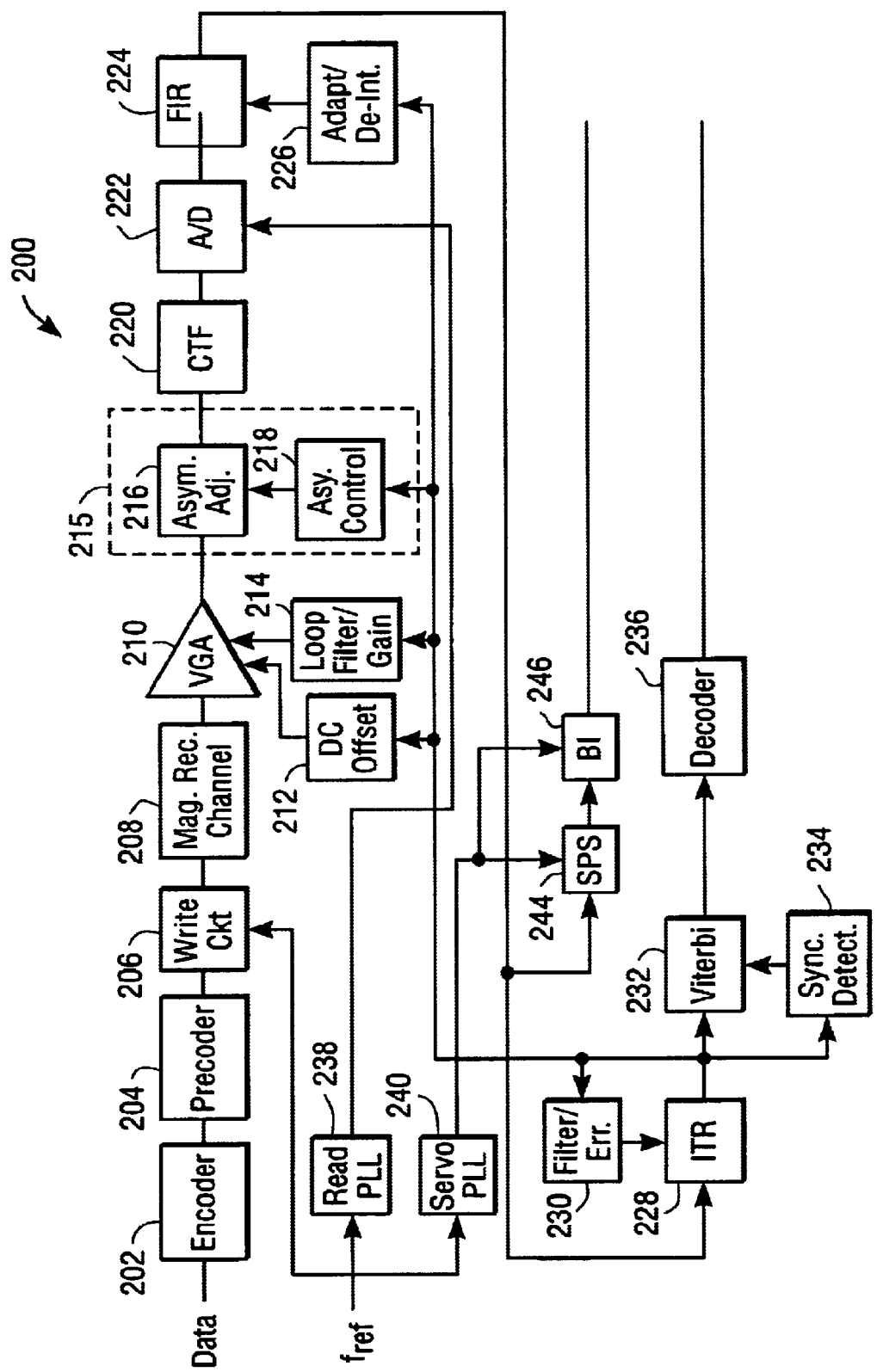
FIG. 1 is a diagram of an exemplary read/write channel according to the present invention.

Turning now to the drawings and, with particular attention to FIG. 1, a block diagram of a sampled amplitude read channel according to an embodiment of the invention is shown and identified by the reference numeral 200. As will be discussed in greater detail below, the sampled amplitude read channel 200 may implement an E2PRML type channel or an EPRML type channel.

During a write operation, data is written onto the media. The data is encoded in an encoder 202, such as a run length limited (RLL) or other encoder. A precoder 204 precodes the sequence to compensate for the transfer function of the magnetic recording channel 208 and equalizing filters. As will be discussed in greater detail below, the precoder/encoder may encode the data such that after precoding the data has a pre-determined parity structure. Further details on such decoding may be obtained from U.S. Pat. No. 5,809,081, which is hereby incorporated by reference in its entirety as if fully set forth herein. Turning back to FIG. 1, the write circuitry 206 modulates the current in the recording head coil to record a binary sequence onto the medium. A reference frequency $f_{ref}$ provides a write clock to the write circuitry 206.

The bit sequence is then provided to a variable gain amplifier 210 to adjust the amplitude of the signal. DC offset control 212 and loop filter/gain error correction 214 may be provided to control the adjustment of the VGA 210. Further, an asymmetry control unit 215 including an asymmetry adjustment unit 216 and asymmetry control 218 may be provided to compensate for magneto-resistive asymmetry effects.

The signal is then provided to a continuous time filter 220, which may be a Butterworth filter, for example, to attenuate high frequency noise and minimize aliasing into baseband after sampling. The signal is then provided to an analog to digital converter 222 to sample the output of the continuous time filter 220.

A finite impulse response filter 224 provides additional equalization of the signal to the desired response. The output of the FIR 224 is provided to an interpolated timing recovery unit 228, which is used to recover the discrete time sequence. The output of the interpolated timing recovery unit is used to provide a feedback control to the DC offset control 212, the gain error 214, the asymmetry control 218 and the FIR 224 control 226. The output of the interpolated timing recovery 228 is provided to a Viterbi detector 232 to provide maximum likelihood detection. Further, the ITR output is provided to a sync detector 234. Sync mark information is then provided to the Viterbi detector 232 for use in sequence detection. The Viterbi detector output is then provided to the decoder 236 which decodes the encoding provided by the encoder 202. The Viterbi detector 232 may implement either of the trellises described below.

Figure 2:
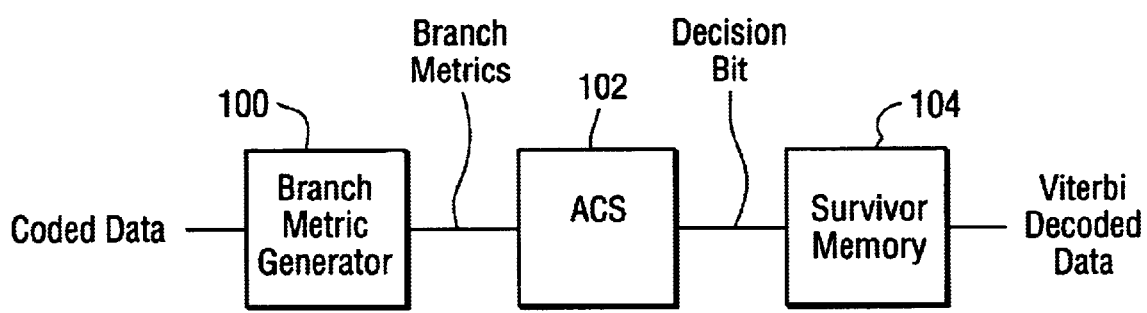
FIG. 2 is a diagram illustrating an exemplary trellis implementation for the read/write channel of FIG. 1.

FIG. 2 illustrates a Viterbi decoder employing a trellis according to the present invention. The Viterbi decoder includes a branch metric generator 100, an add-carry-select (ACS) unit 102, and a survivor memory 104. The branch metric generator 100 receives coded data and calculates a branch metric, which is a distance between codes on each branch corresponding to a received signal. As will be discussed in greater detail below, in implementing a non-stationary EPRML type channel, a predetermined number of paths between nodes are constrained to be not valid. In particular, in one implementation, when a sample corresponding to a last coordinate of a codeword reaches the detector every Pth clock (where P is the block length of the code), the edges are not valid. Similarly, in implementing an E2PRML type channel, four edges are eliminated every k mod 9 clock cycles, where k={1, 2, 4, 6, 8}.

The ACS unit 102 receives the branch metrics from the branch metric generator 100, adds them to the previous path metric, and determines a plurality of candidate paths. The ACS 102 then compares the plurality of ACS path metric values and selects a path having the shortest path metric, and outputs the newly selected path metric and the compared result, namely the decision bit. The ACS unit 102 updates the path metric by using the branch metric obtained from the branch metric generator 100 at each decoding cycle and outputs a decision bit for every state in the trellis. The survivor memory 104 stores the decision bit obtained from the ACS unit 102, receives the original information sequence by using the decision bit, and outputs it as Viterbi-decoded data.

Figure 3:
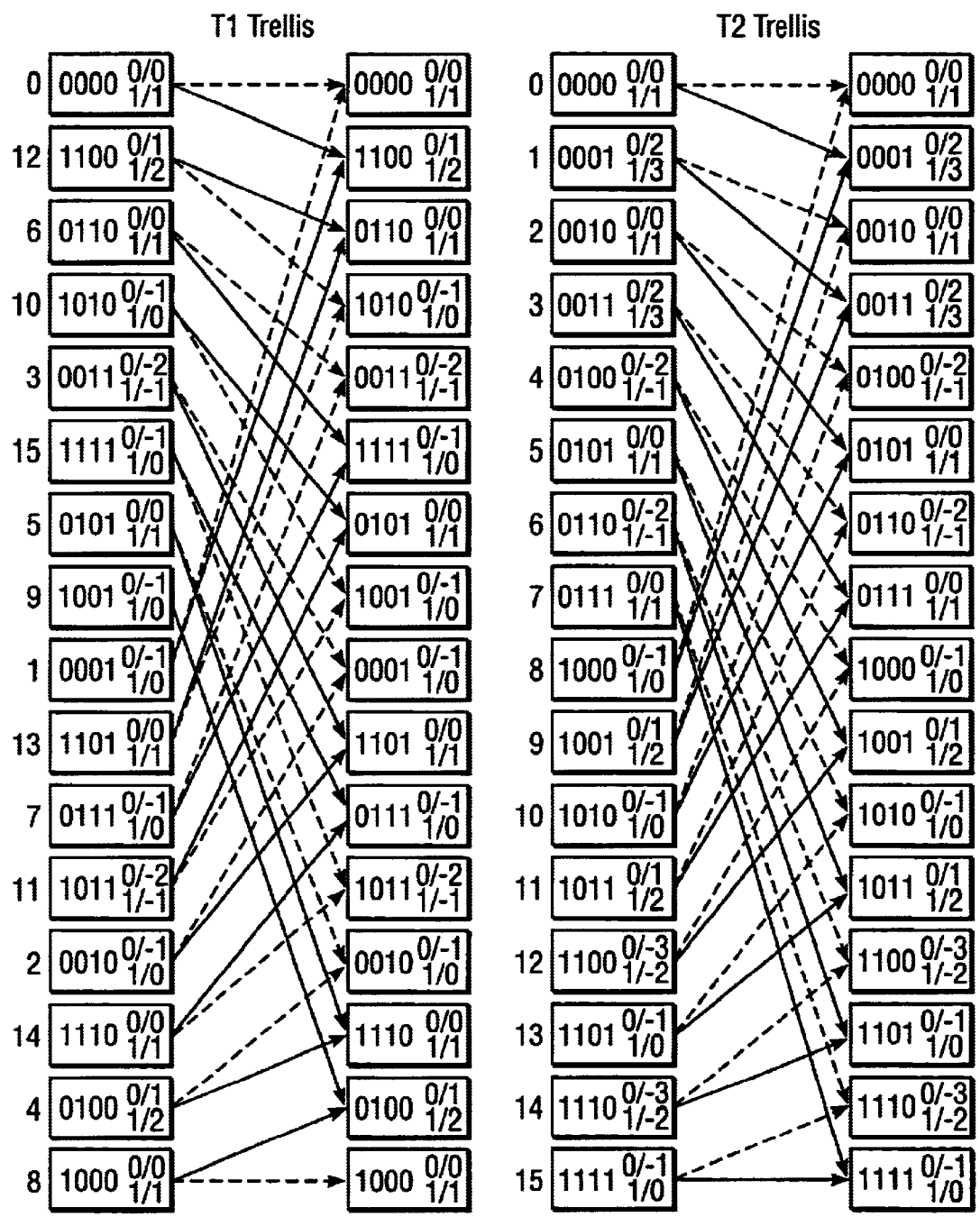
FIG. 3 is a diagram of a pair of trellises having identical connectivity.

The trellises are illustrated in greater detail with reference to FIG. 3. As shown, a pair of trellises, T1 and T2, having identical connectivity are illustrated. In FIGS. 3–6, it is noted that a solid arrow means the NRZ state is a "1" and a dotted arrow means the NRZ state is a "0".

The following provides the general framework for the implementation described below:

Let Finite State Transition Diagram (FSTD) H1 be defined as follows:

States of H1: They are denoted by binary n-tuples (a1 a2 a3 . . . an), where ai=0 or 1, Edges of H1: There is an edge, e, from (a1 a2 a3 . . . an) to (b1 b2 b3 . . . bn) if and only if (b1 b2 b3 . . . b(n−1))=(a2 a3 . . . an). Edge e is labeled bn.

Let FSTD H2 be defined as:

States of H2: They are denoted by binary n-tuples (p u(n−1) u(n−2) u(n−3) . . . u1), where ui=0 or 1 and p=0 or 1.

Edges of H2: There is an edge, e, from (p1 u(n−1) u(n−2) u(n−3) . . . u1) to (p2 v(n−1) v(n−2) v(n−3) . . . v1) if and only if (v(n−2) v(n−3) . . . v1)=(u(n−1) u(n−2) u(n−3) . . . u2), and p2=v(n−1) $\oplus$ p1. ($\oplus$ denotes exclusive-OR operation). Edge e is labeled v(n−1).

Theorem 1: The di-graphs H1 and H2 are isomorphic.

Proof: Let map F be from states of H1 to states of H2, where F((a1 a2 a3 . . . an))=(an, a(n−1) $\oplus$ an, . . . a4 $\oplus$ a3, a3 $\oplus$ a2, a2 $\oplus$ a1).

Map F is one-to-one; moreover, it establishes the isomorphism.

The trellis of H1 can support PRML (or an extended PRML) constraint, and the trellis of H2 can support PRML with parity (or an extended PRML with parity) constraint.

Using Theorem 1 we can prove the following.

Theorem 2: If h1(D) and h2(D) are two channel filters with orders n and n−1, respectively, then the FSTD supporting h1(D) is isomorphic to the FSTD supporting h2(D) with parity.

Proof: Let H1 and H2 support h1(D) and h2(D) sequences, respectively, and let the coordinate p denote the parity information.

Thus if h1(D) and h2(D) are two channel filters with orders n and n−1, respectively, then one can use the same underlying trellis to detect both h1(D) and h2(D) with parity.

Such an implementation is described below. The trellises T1 and T2 of FIG. 3 illustrate NRZ (non-return-to-zero) states. Using the NRZ convention, a one (1) represents a particular direction of magnetization, and a zero (0) another direction of magnetization. Each trellis T1, T2 includes sixteen (16) states (states 0 to 16, represented in binary as 0000 to 1111). Each of the sixteen states represents four consecutive magnetization states. The notation X/Y represents X=NRZ values and Y=sample values. As is known, EPR sequences take on sample values [0,1,2,1,0] for an isolated pulse, and E2PR sequences take on the sample values [0,1,3,3,1,0] for an isolated pulse.

Figure 4:
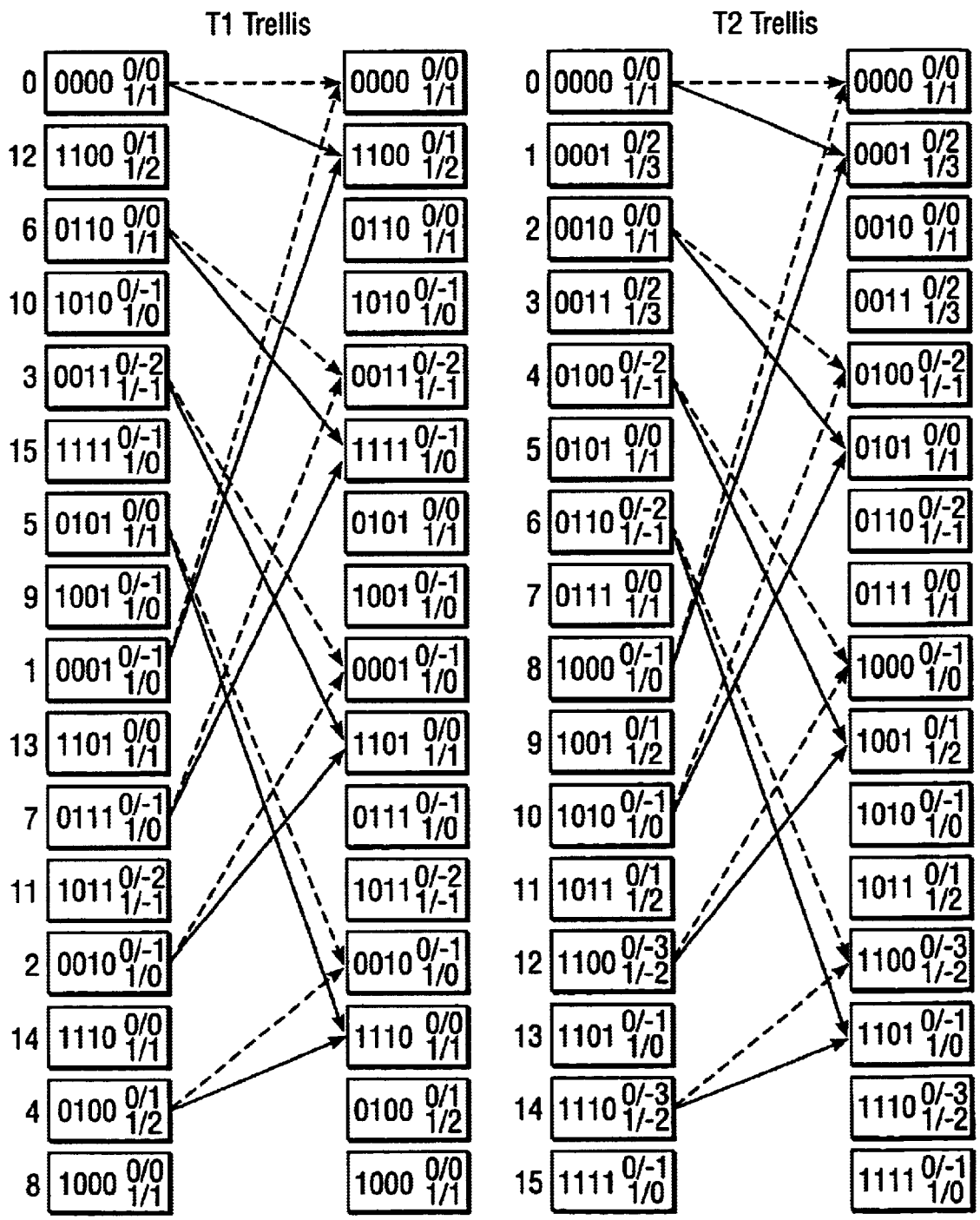
FIG. 4 is a diagram of common NRZ values for the trellises of FIG. 2.
Figure 5:
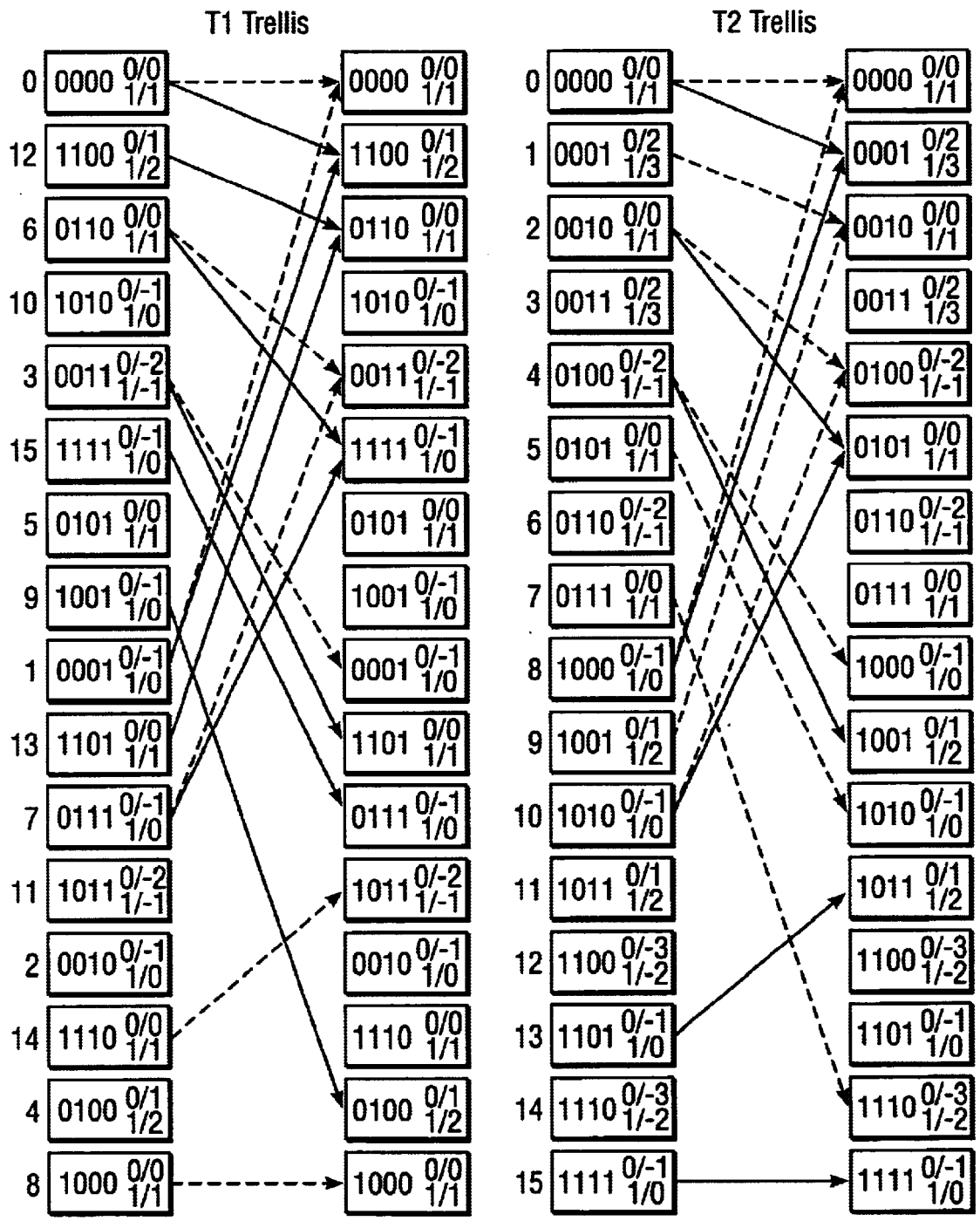
FIG. 5 is a diagram of common sample values for the trellises of FIG. 2.

As can be seen more clearly with reference to FIG. 4, sixteen of thirty-two edges in T1 carry the same NRZ values as the corresponding edges of trellis T2. Further, as shown in FIG. 5, sixteen of thirty-two edges in T1 carry the same sample values as their corresponding edges of T2 (though do not necessarily have the same NRZ values). Thus, a Viterbi detector based on trellis T1 can be modified to operate on trellis T2 by replacing 16 sample values and 16 NRZ values of T1.

Figure 6:
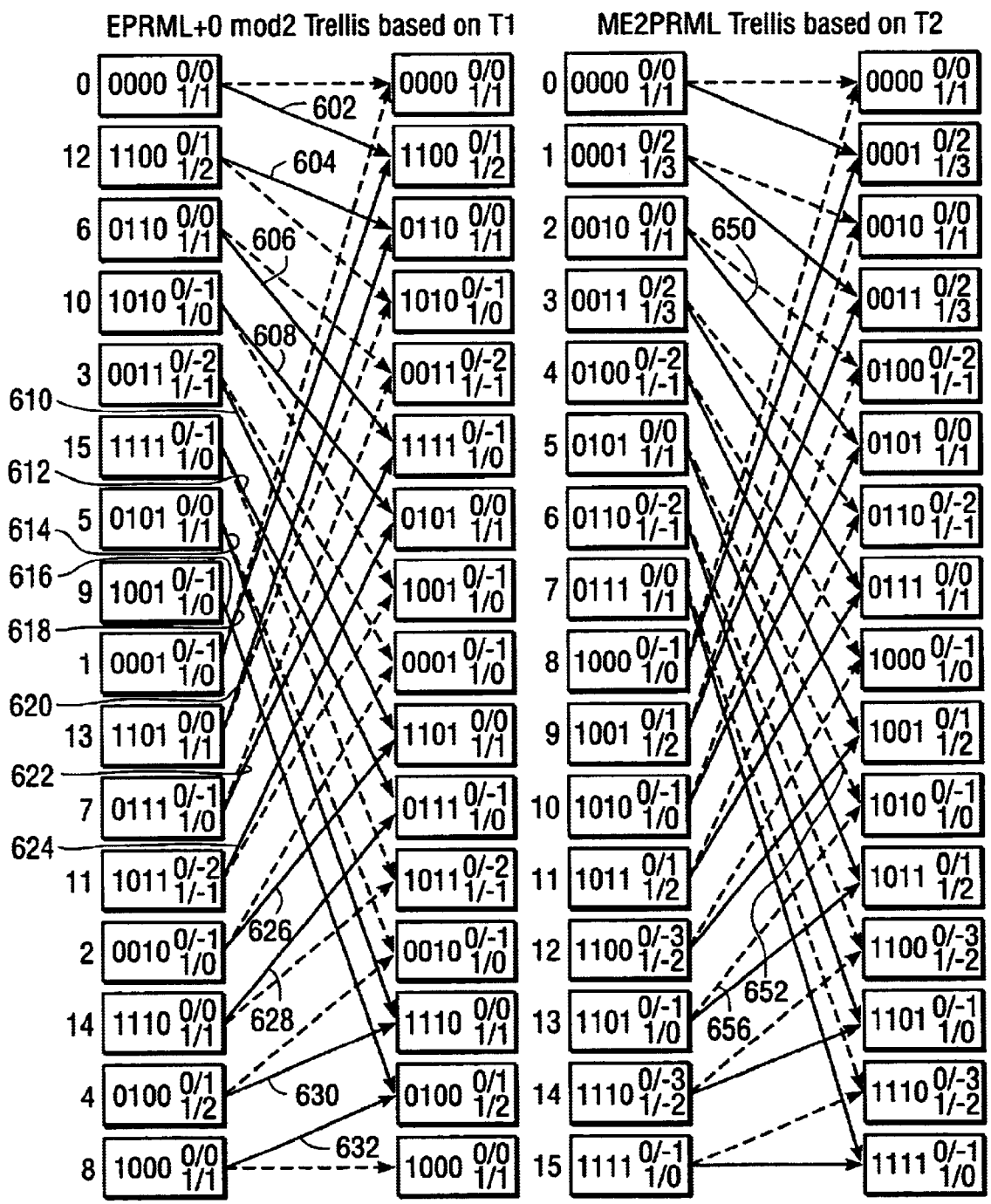
FIG. 6 is a diagram of M2EPRML and ME2PRML implementation using the trellises of FIG. 3.

In particular, as shown in FIG. 6, T1 can support an EPRML type system if sixteen (16) of its edges are "eliminated" every P clock cycles, where P is the block length of the code. In particular, the edges 602–632 are eliminated. These edges are "eliminated" every time a sample that corresponds to a last coordinate of a codeword reaches the Viterbi detector. In other words, for such a sample, the edges are not valid. In one implementation, P=51.

Similarly, as shown in FIG. 6, the trellis T2 can support ME2PRML sequences if four (4) of its edges are "eliminated" every clock=k mod 9, for k in (1, 2, 4, 6, 8). In particular, the edges 650–656 are eliminated.

Figure 7:
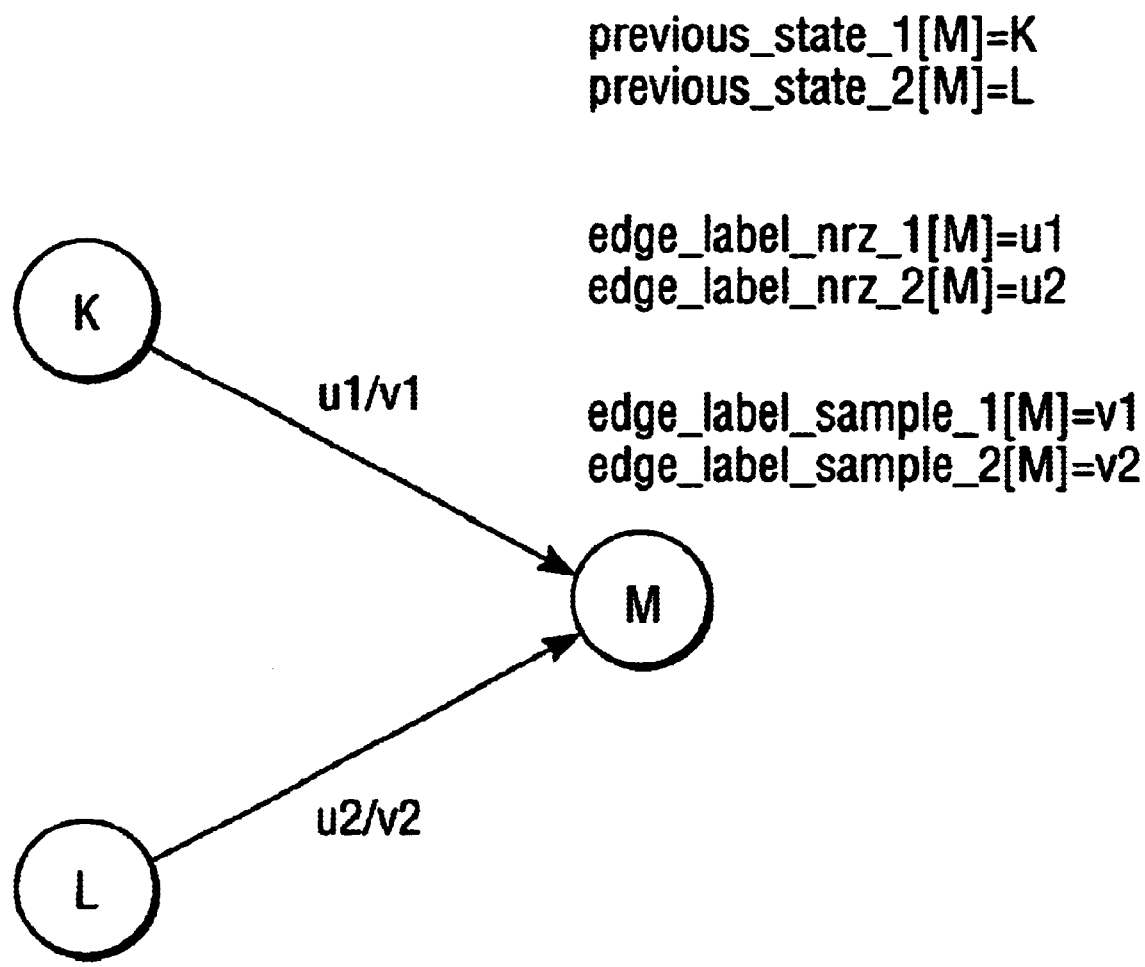
FIG. 7 is a state transition diagram for states of the trellises of FIG. 4.

State transitions for the trellises T1 and T2 are defined more particularly with reference to FIG. 7 and Table 1 and 2 below. In particular, FIG. 7 illustrates three states: an end state M, and two beginning states K and L. As can be seen, the transitions from states K and L are associated with NRZ labels u1, u2, respectively, and sample labels, v1 and v2, respectively. Thus, transitions to state M may be defined as follows:

Previous_state_1[M]=K

Previous_state_2[M]=L

Edge_label_nrz_1[M]=u1

Edge_label_nrz_2[M]=u2

Edge_label_sample_1[M]=v1

Edge_label_sample_2[M]=v2

The T1 trellis is defined with reference to Table 1 below: number_of_states=18;

TABLE 1

| | |
|---|---|
| previous_state_1[0]=0; | previous_state_2[0]=1; |
| previous_state_1[1]=2; | previous_state_2[1]=3; |
| previous_state_1[2]=4; | previous_state_2[2]=5; |
| previous_state_1[3]=16; | previous_state_2[3]=7; |
| previous_state_1[4]=8; | previous_state_2[4]=9; |
| previous_state_1[5]=10; | previous_state_2[5]=11; |
| previous_state_1[6]=12; | previous_state_2[6]=13; |
| previous_state_1[16]=12; | previous_state_2[16]=13; |
| previous_state_1[7]=14; | previous_state_2[7]=15; |
| previous_state_1[8]=8; | previous_state_2[8]=9; |
| previous_state_1[9]=10; | previous_state_2[9]=11; |
| previous_state_1[10]=12; | previous_state_2[10]=13; |
| previous_state_1[11]=17; | previous_state_2[11]=15; |
| previous_state_1[12]=0; | previous_state_2[12]=1; |
| previous_state_1[13]=2; | previous_state_2[13]=3; |
| previous_state_1[14]=4; | previous_state_2[14]=5; |
| previous_state_1[17]=4; | previous_state_2[17]=5; |
| previous_state_1[15]=6; | previous_state_2[15]=7; |
| edge_label_nrz_1[0]=0; | edge_label_sample_1[0]=0; |
| edge_label_nrz_2[0]=0; | edge_label_sample_2[0]=−1; |
| edge_label_nrz_1[1]=0; | edge_label_sample_1[1]=−1; |
| edge_label_nrz_2[1]=0; | edge_label_sample_2[1]=−2; |
| edge_label_nrz_1[2]=0; | edge_label_sample_1[2]=1; |
| edge_label_nrz_2[2]=0; | edge_label_sample_2[2]=0; |
| edge_label_nrz_1[3]=0; | edge_label_sample_1[3]=0; |
| edge_label_nrz_2[3]=0; | edge_label_sample_2[3]=−1; |
| edge_label_nrz_1[4]=1; | edge_label_sample_1[4]=1; |
| edge_label_nrz_2[4]=1; | edge_label_sample_2[4]=0; |
| edge_label_nrz_1[5]=1; | edge_label_sample_1[5]=0; |
| edge_label_nrz_2[5]=1; | edge_label_sample_2[5]=−1; |

TABLE 1-continued

| | |
|---|---|
| edge_label_nrz_1[6]=1; | edge_label_sample_1[6]=2; |
| edge_label_nrz_2[6]=1; | edge_label_sample_2[6]=1; |
| edge_label_nrz_1[16]=1; | edge_label_sample_1[16]=2; |
| edge_label_nrz_2[16]=1; | edge_label_sample_2[16]=1; |
| edge_label_nrz_1[7]=1; | edge_label_sample_1[7]=1; |
| edge_label_nrz_2[7]=1; | edge_label_sample_2[7]=0; |
| edge_label_nrz_1[8]=0; | edge_label_sample_1[8]=0; |
| edge_label_nrz_2[8]=0; | edge_label_sample_2[8]=−1; |
| edge_label_nrz_1[9]=0; | edge_label_sample_1[9]=−1; |
| edge_label_nrz_2[9]=0; | edge_label_sample_2[9]=−2; |
| edge_label_nrz_1[10]=0; | edge_label_sample_1[10]=1; |
| edge_label_nrz_2[10]=0; | edge_label_sample_2[10]=0; |
| edge_label_nrz_1[11]=0; | edge_label_sample_1[11]=0; |
| edge_label_nrz_2[11]=0; | edge_label_sample_2[11]=−1; |
| edge_label_nrz_1[12]=1; | edge_label_sample_1[12]=1; |
| edge_label_nrz_2[12]=1; | edge_label_sample_2[12]=0; |
| edge_label_nrz_1[13]=1; | edge_label_sample_1[13]=0; |
| edge_label_nrz_2[13]=1; | edge_label_sample_2[13]=−1; |
| edge_label_nrz_1[14]=1; | edge_label_sample_1[14]=2; |
| edge_label_nrz_2[14]=1; | edge_label_sample_2[14]=1; |
| edge_label_nrz_1[17]=1; | edge_label_sample_1[17]=2; |
| edge_label_nrz_2[17]=1; | edge_label_sample_2[17]=1; |
| edge_label_nrz_1[15]=1; | edge_label_sample_1[15]=1; |
| edge_label_nrz_2[15]=1; | edge_label_sample_2[15]=0; |

The T2 trellis is described with reference to Table 2 below: number_of_states=18;

TABLE 2

| | |
|---|---|
| previous_state_1[0]=0; | previous_state_2[0]=8; |
| previous_state_1[1]=0; | previous_state_2[1]=8; |
| previous_state_1[2]=1; | previous_state_2[2]=9; |
| previous_state_1[16]=1; | previous_state_2[16]=9; |
| previous_state_1[3]=1; | previous_state_2[3]=9; |
| previous_state_1[4]=16; | previous_state_2[4]=10; |
| previous_state_1[5]=2; | previous_state_2[5]=10; |
| previous_state_1[6]=3; | previous_state_2[6]=11; |
| previous_state_1[7]=3; | previous_state_2[7]=11; |
| previous_state_1[8]=4; | previous_state_2[8]=12; |
| previous_state_1[9]=4; | previous_state_2[9]=12; |
| previous_state_1[10]=5; | previous_state_2[10]=13; |
| previous_state_1[11]=5; | previous_state_2[11]=17; |
| previous_state_1[12]=6; | previous_state_2[12]=14; |
| previous_state_1[13]=6; | previous_state_2[13]=14; |
| previous_state_1[17]=6; | previous_state_2[17]=14; |
| previous_state_1[14]=7; | previous_state_2[14]=15; |
| previous_state_1[15]=7; | previous_state_2[15]=15; |
| edge_label_nrz_1[0]=0; | edge_label_sample_1[0]=0; |
| edge_label_nrz_2[0]=0; | edge_label_sample_2[0]=−1; |
| edge_label_nrz_1[1]=1; | edge_label_sample_1[1]=1; |
| edge_label_nrz_2[1]=1; | edge_label_sample_2[1]=0; |
| edge_label_nrz_1[2]=0; | edge_label_sample_1[2]=−2; |
| edge_label_nrz_2[2]=0; | edge_label_sample_2[2]=1; |
| edge_label_nrz_1[16]=0; | edge_label_sample_1[16]=2; |
| edge_label_nrz_2[16]=0; | edge_label_sample_2[16]=1; |
| edge_label_nrz_1[3]=1; | edge_label_sample_1[3]=3; |
| edge_label_nrz_2[3]=1; | edge_label_sample_2[3]=2; |
| edge_label_nrz_1[4]=0; | edge_label_sample_1[4]=0; |
| edge_label_nrz_2[4]=0; | edge_label_sample_2[4]=−1; |
| edge_label_nrz_1[5]=1; | edge_label_sample_1[5]=1; |
| edge_label_nrz_2[5]=1; | edge_label_sample_2[5]=0; |
| edge_label_nrz_1[6]=0; | edge_label_sample_1[6]=2; |
| edge_label_nrz_2[6]=0; | edge_label_sample_2[6]=1; |
| edge_label_nrz_1[7]=1; | edge_label_sample_1[7]=3; |
| edge_label_nrz_2[7]=1; | edge_label_sample_2[7]=2; |
| edge_label_nrz_1[8]=0; | edge_label_sample_1[8]=−2; |
| edge_label_nrz_2[8]=0; | edge_label_sample_2[8]=−3; |
| edge_label_nrz_1[9]=1; | edge_label_sample_1[9]=−1; |
| edge_label_nrz_2[9]=1; | edge_label_sample_2[9]=−2; |
| edge_label_nrz_1[10]=0; | edge_label_sample_1[10]=0; |
| edge_label_nrz_2[10]=0; | edge_label_sample_2[10]=−1; |
| edge_label_nrz_1[11]=1; | edge_label_sample_1[11]=1; |
| edge_label_nrz_2[11]=1; | edge_label_sample_2[11]=0; |
| edge_label_nrz_1[12]=0; | edge_label_sample_1[12]=−2; |
| edge_label_nrz_2[12]=0; | edge_label_sample_2[12]=−3; |
| edge_label_nrz_1[13]=1; | edge_label_sample_1[13]=−1; |

TABLE 2-continued

| | |
|---|---|
| edge_label_nrz_2[13]=1; | edge_label_sample_2[13]=−2; |
| edge_label_nrz_1[17]=1; | edge_label_sample_1[17]=−1; |
| edge_label_nrz_2[17]=1; | edge_label_sample_2[17]=−2; |
| edge_label_nrz_1[14]=0; | edge_label_sample_1[14]=0; |
| edge_label_nrz_2[14]=0; | edge_label_sample_2[14]=−1; |
| edge_label_nrz_1[15]=1; | edge_label_sample_1[15]=1; |
| edge_label_nrz_2[15]=1; | edge_label_sample_2[15]=0; |

The mapping between the T1 and T2 states is shown in Table 3 below;

TABLE 3

| ME2PRML States | M2EPRML states |
|---|---|
| 0 | 0 |
| 1 | 12 |
| 2 | 6 |
| 3 | 10 |
| 4 | 3 |
| 5 | 15 |
| 6 | 5 |
| 7 | 9 |
| 8 | 1 |
| 9 | 13 |
| 10 | 7 |
| 11 | 11 |
| 12 | 2 |
| 13 | 14 |
| 14 | 4 |
| 15 | 8 |
| 16 | 16 |
| 17 | 17 |

It is noted that, while shown above implemented with 18 states, the above trellis nay be implemented with 16 states as shown in the figures by eliminating states 16 and 17. Thus, the trellis is exemplary only.

The invention described in the above detailed description is not intended to be limited it the specific form set forth herein, but is intended to cover such alternatives, modifications and equivalents as can reasonably be included within the spirit and scope of the appended claims.

What is claimed:

1. A Viterbi decoder, comprising:
a Viterbi trellis structure having a preset number of states and supporting preset transitions from beginning to end states in the trellis structure, each state in the trellis structure having a state label for identifying consecutive bit values represented by the state, each transition supported by the trellis structure having an edge label for identifying one or more parameters for the transition, wherein the decoder has an EPRML mode and an E2PRML mode, wherein in the EPRML mode the state labels and the edge labels have a first set of values to support an EPRML type channel and in the E2PRML mode the state labels and the edge labels have a second set of values to support an E2PRML type channel using the same preset transitions in the trellis structure.

2. The decoder of claim 1, wherein said EPRML type channel has predetermined parity.

3. The decoder of claim 2, wherein said parity is 0 mod 2 parity.

4. The decoder of claim 3, wherein the trellis structure has sixteen states and thirty two transitions, and in the EPRML mode the decoder is configured to invalidate sixteen transitions between states in the trellis structure every P clock cycles, where P is the block length of a received code.

5. The decoder of claim 1, wherein said E2PRML type channel comprises an ME2PRML type channel.

6. The decoder of claim 5, wherein the decoder is configured in the E2PRML mode to invalidate four transitions between states in the trellis structure every k mod 9 clocks cycles, where k is {1, 2, 4, 6, 8}.

7. The decoder of claim 1, wherein each transition has an edge label that identifies an NRZ value and a sample value for the transition.

8. A method for configuring a Viterbi decoder, characterized by:
receiving an EPRML set of values and an E2PRML set of values in the decoder that has an EPRML mode and an E2PRML mode and includes a Viterbi trellis structure having a preset number of states and supporting preset transitions from beginning to end states in the trellis structure, each received set including state label values for identifying consecutive bit values for each state in the trellis structure and edge label values for each transition supported by the trellis structure;
if the decoder is in the EPRML mode, setting a state label of each state and an edge label of each transition in the trellis structure to corresponding state label and an edge label values, respectively, in the EPRML set of values to support an EPRML mode type channel using the preset transitions supported by the trellis structure; and
if the decoder is in the E2PRML mode, setting the state label of each state and the edge label of each transition in the trellis structure to corresponding state label and an edge label values, respectively, in the E2PRML set of values to support an E2PRML type channel using the preset transitions supported by the trellis structure.

9. The method of claim 8, wherein:
receiving an EPRML set of values and an E2PRML set of values includes receiving in each set edge label values that includes an NRZ value and a sample value for each transition supported by the trellis structure.

10. A method according to claim 8, wherein said E2PRML type channel comprises an M2EPRML type channel and said E2PRML type channel comprises an ME2PRML type channel.

11. A method according to claim 9, wherein said trellis structure has sixteen states and supports thirty two transitions, and wherein:
receiving an EPRML set of values and an E2PRML set of values includes receiving for sixteen of the thirty-two transitions the same NRZ values in said EPRML set of values and said E2PRML set of values.

12. A method according to claim 11, wherein:
receiving an EPRML set of values and an E2PRML set of values includes receiving for sixteen of the thirty-two transitions the same samples values in said EPRML set of values and said E2PRML set of values.

13. A method according to claim 12, further comprising:
if the decoder is in said EPRML mode, invalidating sixteen transitions every P clock cycles, where P is a block length of an associated code, every time a sample that corresponds to a last coordinate of a codeword reaches the trellis.

14. A method according to claim 13, further comprising:
if the decoder is in said E2PRML mode, invalidating four transitions every k mod 9 clock cycles, where k is {1, 2, 4, 6, 8}.

* * * * *

UNITED STATES PATENT AND TRADEMARK OFFICE
CERTIFICATE OF CORRECTION

PATENT NO. : 6,680,980 B1
DATED : January 20, 2004
INVENTOR(S) : Ashley et al.

It is certified that error appears in the above-identified patent and that said Letters Patent is hereby corrected as shown below:

Title page,
Item [56], References Cited, OTHER PUBLICATIONS, "T. Sugawara" reference, replace "T.Sugawara, M. Yamagishi, H. Mutoh, K. Shimoda, and Y," with
-- T. Sugawara, M. Yamagishi, H. Mutoh, K. Shimoda, and Y. --

Column 7,
Line 64, replace "thirty two" with -- thirty-two --

Column 8,
Line 5, replace "clocks" with -- clock --
Line 35, replace "includes" with -- include --
Lines 10-11, replace "A method for configuring a Viterbi decoder, characterized by:" with -- A method for configuring a Viterbi decoder, comprising --
Line 45, replace "thirty two" with -- thirty-two --
Line 53, replace "transitions the same samples values" with -- transitions the same sample values --

Signed and Sealed this

Twenty-second Day of June, 2004

JON W. DUDAS
*Acting Director of the United States Patent and Trademark Office*